(12) United States Patent
Jung et al.

(10) Patent No.: US 10,504,855 B2
(45) Date of Patent: Dec. 10, 2019

(54) SEMICONDUCTOR PACKAGE

(71) Applicant: SAMSUNG ELECTRONICS CO., LTD., Suwon-si (KR)

(72) Inventors: Kyung Moon Jung, Suwon-Si (KR); Chul Kyu Kim, Suwon-si (KR); Seok Hwan Kim, Suwon-Si (KR); Kyung Ho Lee, Suwon-Si (KR); Seong Hwan Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/171,126

(22) Filed: Oct. 25, 2018

(65) Prior Publication Data

US 2019/0341354 A1    Nov. 7, 2019

(30) Foreign Application Priority Data

May 3, 2018    (KR) ........................ 10-2018-0051379

(51) Int. Cl.
*H01L 23/043*    (2006.01)
*H01L 23/552*    (2006.01)
(Continued)

(52) U.S. Cl.
CPC ........ *H01L 23/552* (2013.01); *H01L 23/3121* (2013.01); *H01L 23/5226* (2013.01);
(Continued)

(58) Field of Classification Search
CPC ............. H01L 23/043; H01L 23/49805; H01L 23/49811
See application file for complete search history.

(56) References Cited

U.S. PATENT DOCUMENTS 5,953,594 A * 9/1999 Bhatt ................... H01L 21/481
                                                                                              257/703
6,005,289 A * 12/1999 Watanabe ........... H01L 21/4857
                                                                                               257/700
(Continued)

FOREIGN PATENT DOCUMENTS

KR    10-2016-0132763 A    11/2016
KR    10-2017-0079381 A    7/2017
(Continued)

OTHER PUBLICATIONS

Office Action issued in Korean Patent Application No. 10-2018-0051379 dated May 13, 2019, with English translation.

*Primary Examiner* — George R Fourson, III
(74) *Attorney, Agent, or Firm* — Sughrue Mion, PLLC

(57) ABSTRACT

A semiconductor package includes a support member having a first surface and a second surface, and having a through-hole, a first metal layer for shielding disposed on an internal sidewall of the through-hole and the first surface and the second surface of the support member, a connection member disposed on the first surface of the support member, and having a redistribution layer, a semiconductor chip disposed in the through-hole, an encapsulant sealing the semiconductor chip located in the through-hole, and covering the second surface of the support member, a second metal layer for shielding disposed on the encapsulant, and connected to the first metal layer for shielding by a connecting trench via passing through the encapsulant, and a reinforcing via disposed in a region, overlapping the trench via for connection, of the support member, and connected to the first metal layer for shielding.

14 Claims, 16 Drawing Sheets

(51) Int. Cl.
    *H01L 23/522*     (2006.01)
    *H01L 23/00*     (2006.01)
    *H01L 23/31*     (2006.01)
    *H01L 23/498*     (2006.01)

(52) U.S. Cl.
    CPC ............ *H01L 24/09* (2013.01); *H01L 23/043* (2013.01); *H01L 23/49805* (2013.01); *H01L 23/49811* (2013.01); *H01L 2224/02377* (2013.01); *H01L 2224/02379* (2013.01)

(56) References Cited

U.S. PATENT DOCUMENTS

| | | | |
|---|---|---|---|
| 6,221,694 B1 * | 4/2001 | Bhatt | H01L 21/4803 257/E23.004 |
| 7,929,313 B2 | 4/2011 | Ito et al. | |
| 8,736,033 B1 | 5/2014 | Chuo et al. | |
| 9,508,683 B1 | 11/2016 | Choi | |
| 10,079,160 B1 * | 9/2018 | Margomenos | H01L 21/4871 |
| 2007/0200748 A1 * | 8/2007 | Hoegerl | H01L 23/3128 342/85 |
| 2010/0019374 A1 * | 1/2010 | Hundt | H01L 23/36 257/693 |
| 2012/0032337 A1 * | 2/2012 | Lu | H01L 21/4853 257/773 |
| 2013/0075902 A1 * | 3/2013 | Chow | H01L 21/561 257/737 |
| 2013/0249106 A1 * | 9/2013 | Lin | H01L 24/19 257/774 |
| 2015/0098204 A1 * | 4/2015 | Yoshikawa | H01L 23/00 361/767 |
| 2015/0228571 A1 * | 8/2015 | Shiraki | H01L 23/49838 257/701 |
| 2015/0235991 A1 * | 8/2015 | Gu | H01L 25/0655 257/762 |
| 2016/0035663 A1 * | 2/2016 | Huang | H01L 23/3114 257/668 |
| 2016/0338202 A1 | 11/2016 | Park et al. | |
| 2017/0133309 A1 * | 5/2017 | Kim | H01L 23/5389 |
| 2017/0278830 A1 | 9/2017 | Kim | |
| 2017/0287825 A1 | 10/2017 | Lee et al. | |
| 2018/0145061 A1 * | 5/2018 | Jeong | H01L 25/50 |
| 2018/0269188 A1 * | 9/2018 | Yu | H01L 21/561 |

FOREIGN PATENT DOCUMENTS

| | | |
|---|---|---|
| KR | 10-2017-0112363 A | 10/2017 |
| KR | 10-2017-0113743 A | 10/2017 |
| KR | 10-2017-0121666 A | 11/2017 |

* cited by examiner

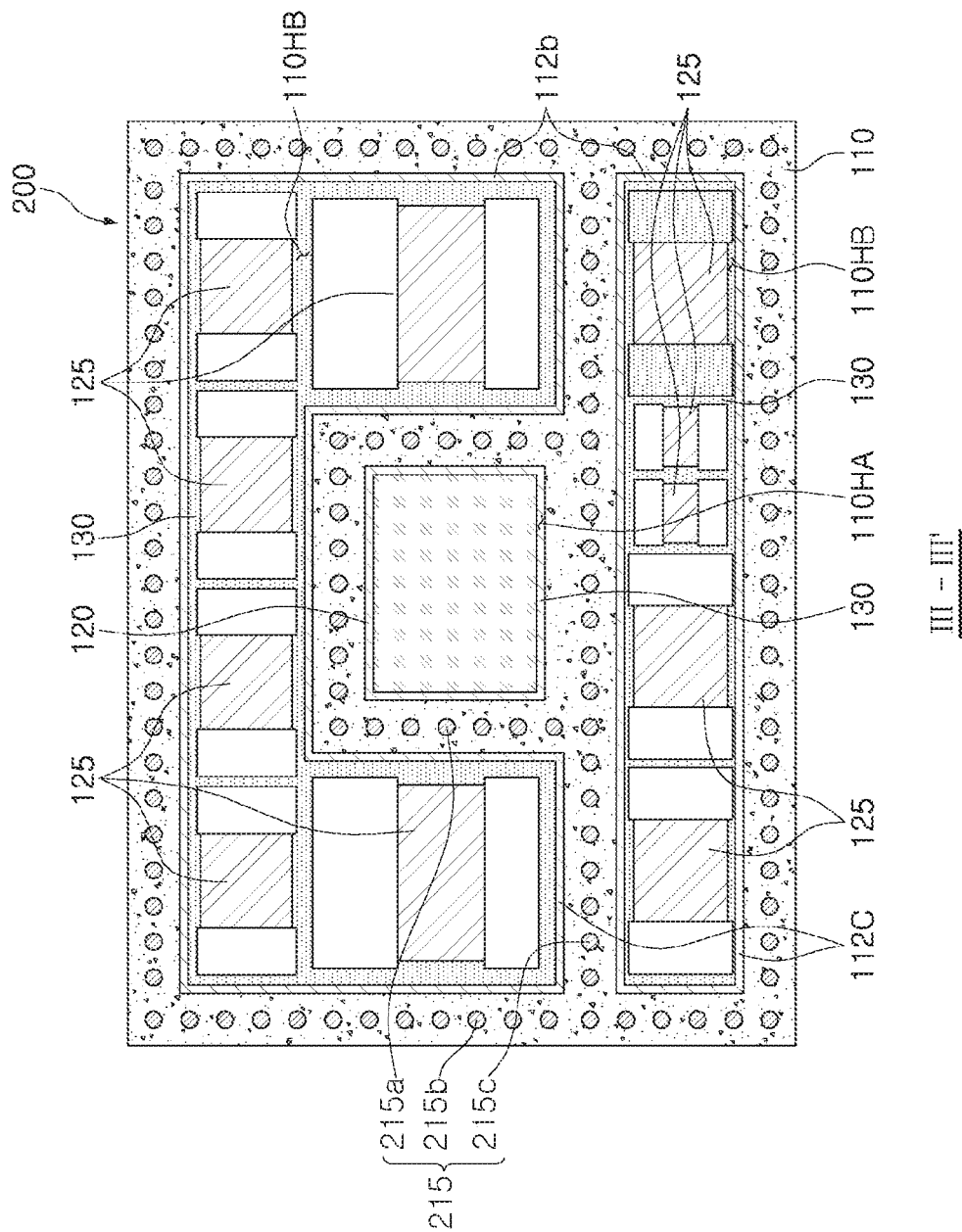

SEMICONDUCTOR PACKAGE

CROSS-REFERENCE TO RELATED APPLICATION

This application claims the benefit of priority to Korean Patent Application No. 10-2018-0051379, filed on May 3, 2018 with the Korean Intellectual Property Office, the entirety of which is incorporated herein by reference.

BACKGROUND

The present disclosure relates to a semiconductor package.

As the sizes of mobile displays increase, increased battery capacity is required. Since the area occupied by the battery may be increased due to the increase in battery capacity, a size of a printed circuit board (PCB) is required to be reduced. As a result, there is continuing interest in modularization, due to a reduction in a mounting area of components.

As a technology for mounting a plurality of components according to the related art, chip on board (COB) technology is exemplified. COB is a method of mounting individual passive components and semiconductor packages on a printed circuit board using Surface Mount Technology (SMT). However, there may be problems in which a large mounting area is required, depending on the minimum spacing between components, electromagnetic interference (EMI) between components is high, and electric noise is increased due to a relatively long distance between a semiconductor chip and a passive component.

Meanwhile, in a miniaturized semiconductor package, a reliability issue regarding thermal load and/or mechanical shock from an external source is significantly emphasized due to a decrease in structural rigidity, and design of a package structure for improving reliability is significant.

SUMMARY

An aspect of the present disclosure provides a semiconductor package capable of improving reliability of an EMI shielding structure connected between components.

According to an aspect of the present disclosure, a semiconductor package includes: a support member having a first surface and a second surface opposing each other, and having a through-hole; a first metal layer disposed on an internal sidewall of the through-hole and the first surface and the second surface of the support member; a connection member disposed on the first surface of the support member, and having a redistribution layer; a semiconductor chip disposed in the through-hole, and having a connection pad connected to the redistribution layer; an encapsulant sealing the semiconductor chip located in the through-hole, and covering the second surface of the support member; a second metal layer disposed on the encapsulant, and connected to the first metal layer by a connecting trench via passing through the encapsulant; and a reinforcing via disposed in a region, overlapping the trench via for connection, of the second surface of the support member, and connected to the first metal layer.

According to an aspect of the present disclosure, a semiconductor package includes: a support member having a first surface and a second surface opposing each other, and having a first through-hole and a second through-hole; a first metal layer disposed on an internal sidewall of at least the second through-hole and the first surface and the second surface of the support member; a connection member disposed on the first surface of the support member, and having a redistribution layer; a semiconductor chip disposed in the first through-hole, and having a connection pad connected to the redistribution layer; at least one passive component disposed in the second through-hole, and having a connection terminal connected to the redistribution layer; an encapsulant sealing the semiconductor chip and the at least one passive component, and covering the second surface of the support member; a second metal layer disposed on the encapsulant; a connecting trench via passing through the encapsulant to connect the first metal layer to the second metal layer, and surrounding the first through-hole and the second through-hole in a plan view perpendicular to a thickness direction of the support member; and a reinforcing via disposed in at least a portion of a region, overlapping the connecting trench via for, of the second surface of the support member, and connected to the first metal layer.

BRIEF DESCRIPTION OF DRAWINGS

The above and other aspects, features, and advantages of the present disclosure will be more clearly understood from the following detailed description taken in conjunction with the accompanying drawings, in which:

FIGS. 15 and 16 are a cross-sectional view and a plan view of a semiconductor package according to an exemplary embodiment of the present disclosure.

DETAILED DESCRIPTION

Figure 1:
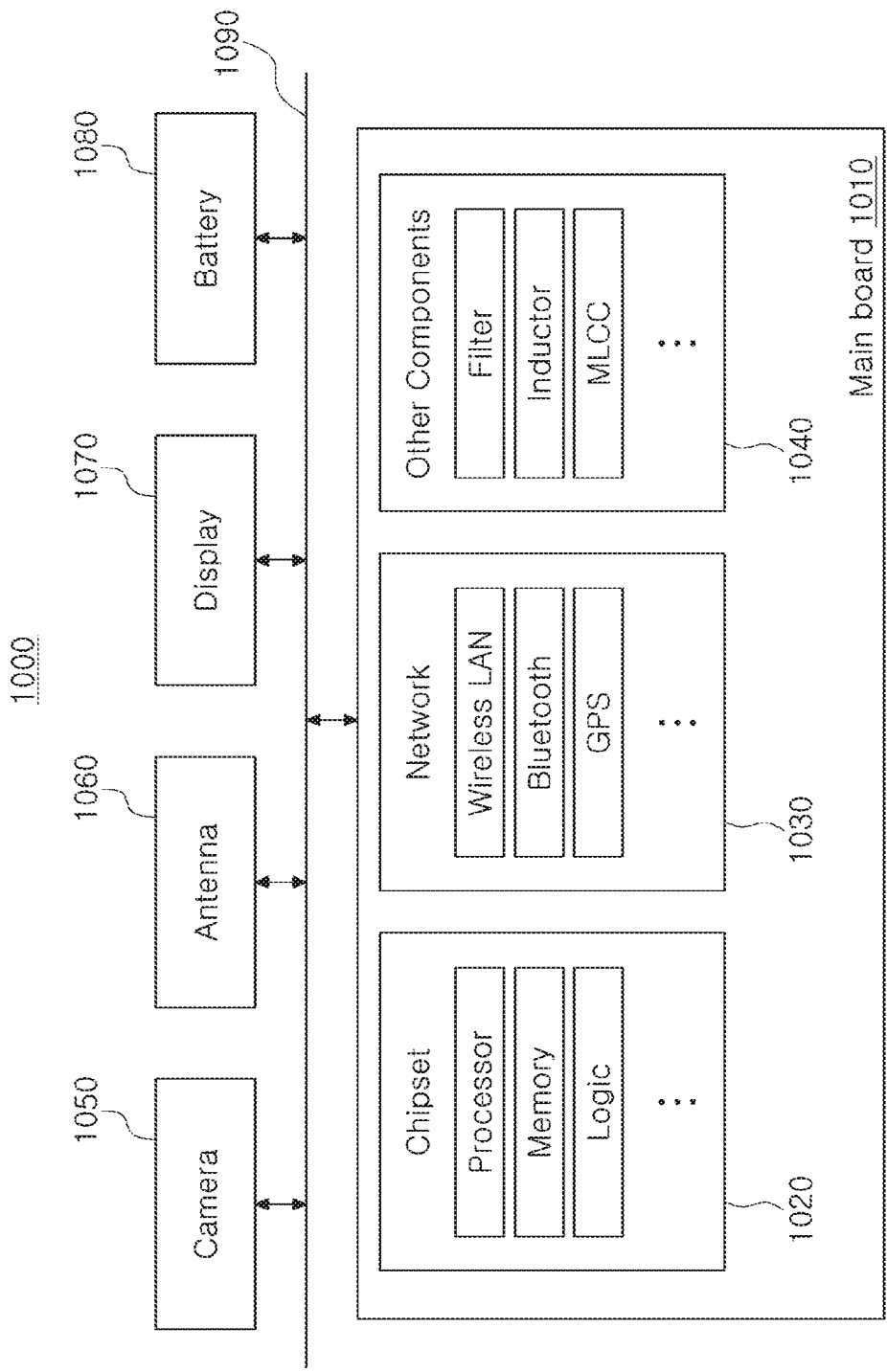
FIG. 1 is a schematic block diagram illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being 'on,' 'connected to,' or 'coupled to' another element, it can be directly 'on,' 'connected to,' or 'coupled to' the other element or other elements intervening therebetween may be present. In contrast, when an element is referred to as being 'directly on,' 'directly connected to,' or 'directly coupled to' another element, there may be no other elements or layers intervening therebetween. Like numerals refer to like elements throughout. As used herein, the term 'and/or' includes any and all combinations of one or more of the associated listed items.

It will be apparent that although the terms first, second, third, etc. may be used herein to describe various members, components, regions, layers and/or sections, any such members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as 'above,' 'upper,' 'below,' and 'lower' and the like, may be used herein for ease of description to describe one element's relationship relative to another element(s) as shown in the figures. It will be understood that spatially relative terms are intended to encompass different orientations of the device in use or operation, in addition to the orientation depicted in the figures. For example, if the device in the figures is turned over, elements described as 'above,' or 'upper' relative to other elements would then be oriented 'below,' or 'lower' relative to the other elements or features. Thus, the term 'above' can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms 'a,' 'an,' and 'the' are intended to include the plural forms as well, unless the context clearly indicates otherwise. It will be further understood that the terms 'comprises,' and/or 'comprising' when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted alone, in combination or in partial combination.

The contents of the present disclosure described below may have a variety of configurations and propose only a required configuration herein, but are not limited thereto.

Embodiments of the present disclosure will hereinafter be described with reference to the attached drawings. The shapes or sizes of components shown in the drawings are exaggerated for clarity.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, and may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip associated components 1020 or the network associated components 1030 described above.

Depending on a type of the electronic device 1000, the electronic device 1000 includes other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
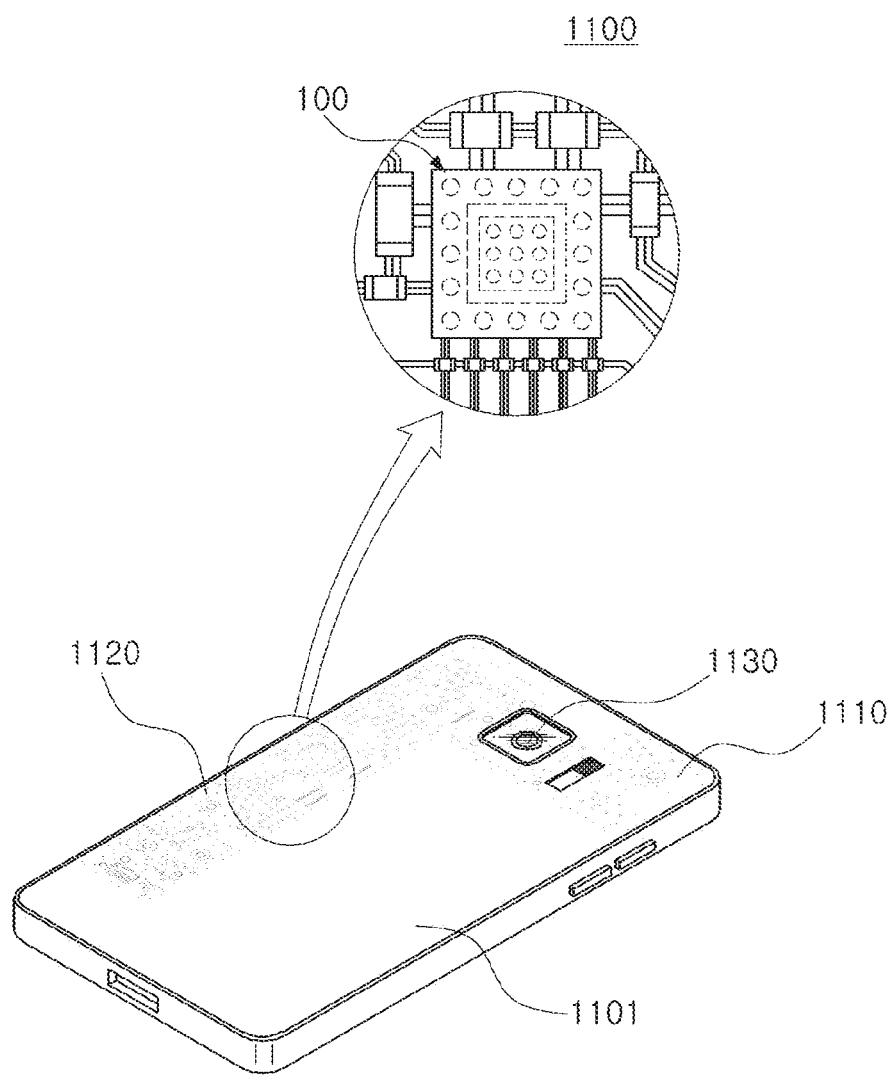
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the main board 1010, such as a camera module 1130, may be accommodated in the body 1101. Some of the electronic components 1120 may be chip related components, and a semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the attached drawings.

Fan-in Semiconductor Package

Figure 3B:
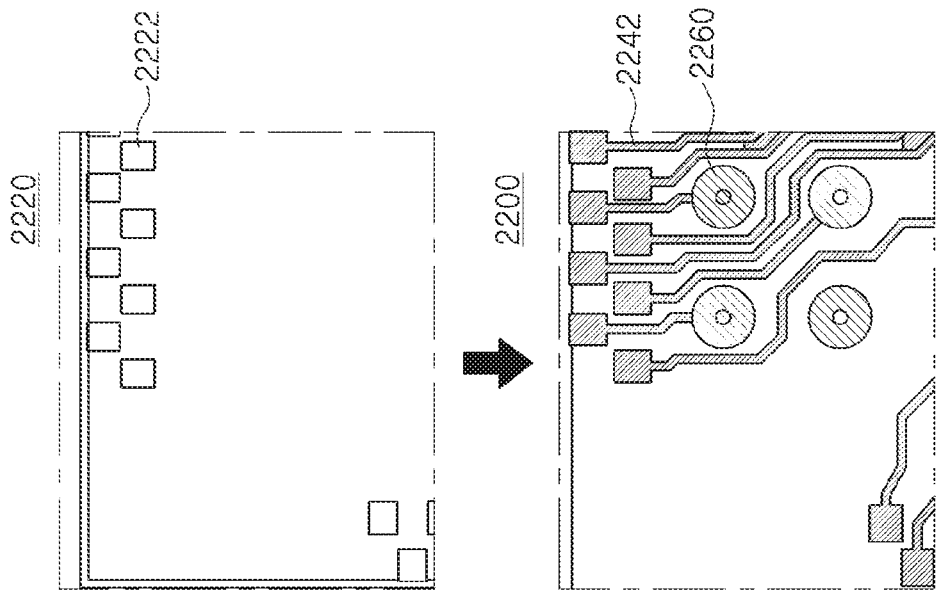
FIGS. 3A and 3B are schematic cross-sectional views illustrating states of a fan-in semiconductor package before and after being packaged.
Figure 3A:
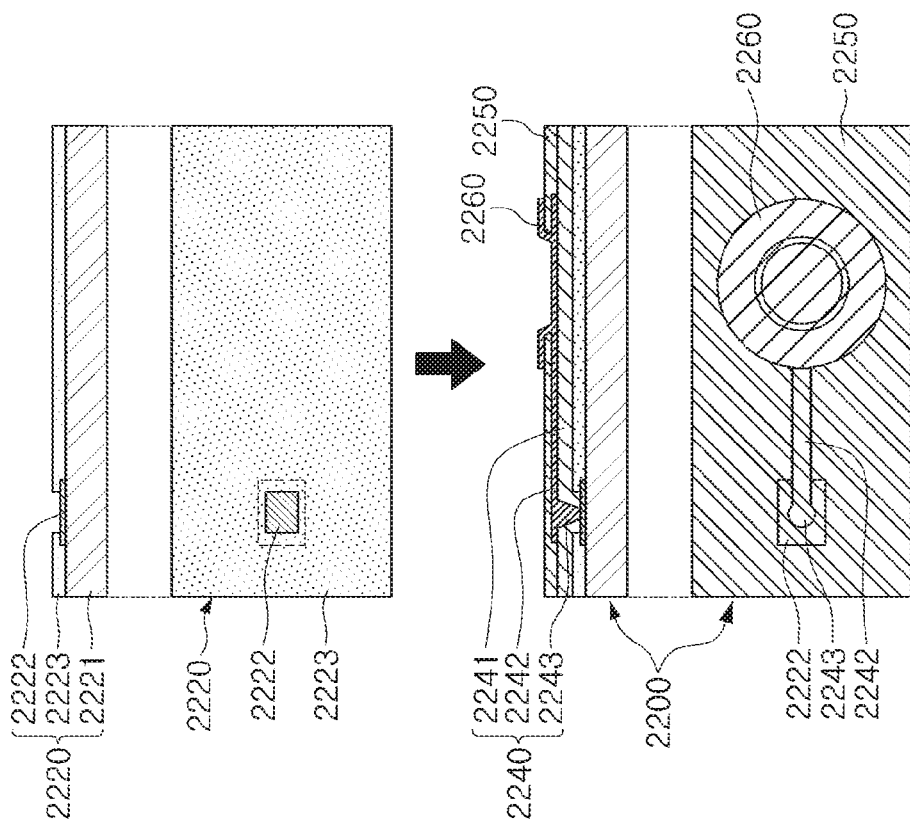
Figure 4:
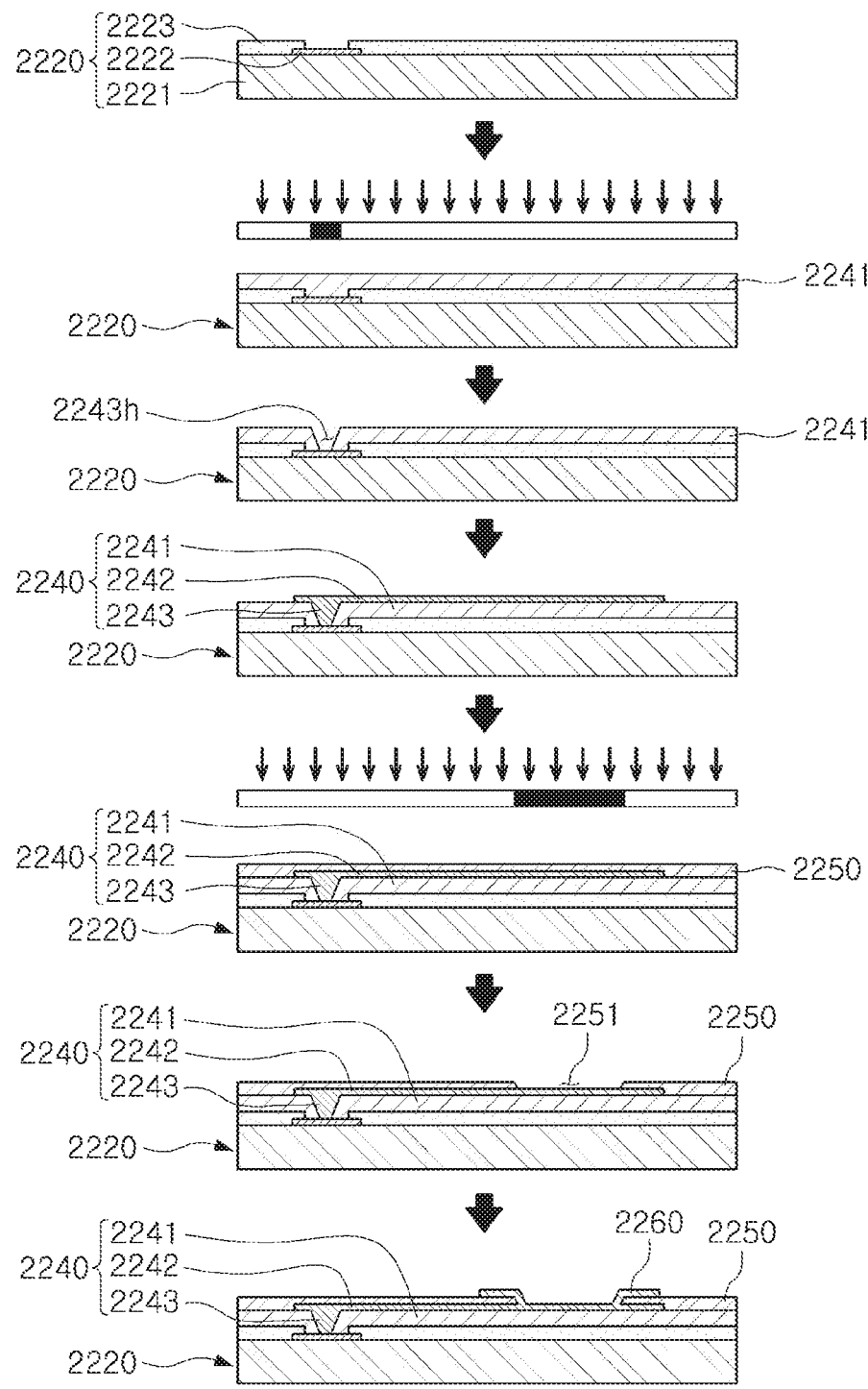
FIG. 4 is schematic cross-sectional views illustrating a packaging process of a fan-in semiconductor package.

FIGS. 3A and 3B are schematic cross-sectional views illustrating states of a fan-in semiconductor package before and after being packaged, and FIG. 4 are schematic cross-sectional views illustrating a packaging process of a fan-in semiconductor package.

Referring to FIGS. 3A, 3B and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimageable dielectric (PID) resin, forming via holes 2243h exposing the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at low cost. Therefore, many elements mounted in smartphones have been manufactured in fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. Here, even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may be insufficient to directly mount the fan-in semiconductor package on the mainboard of the electronic device.

Figure 5:
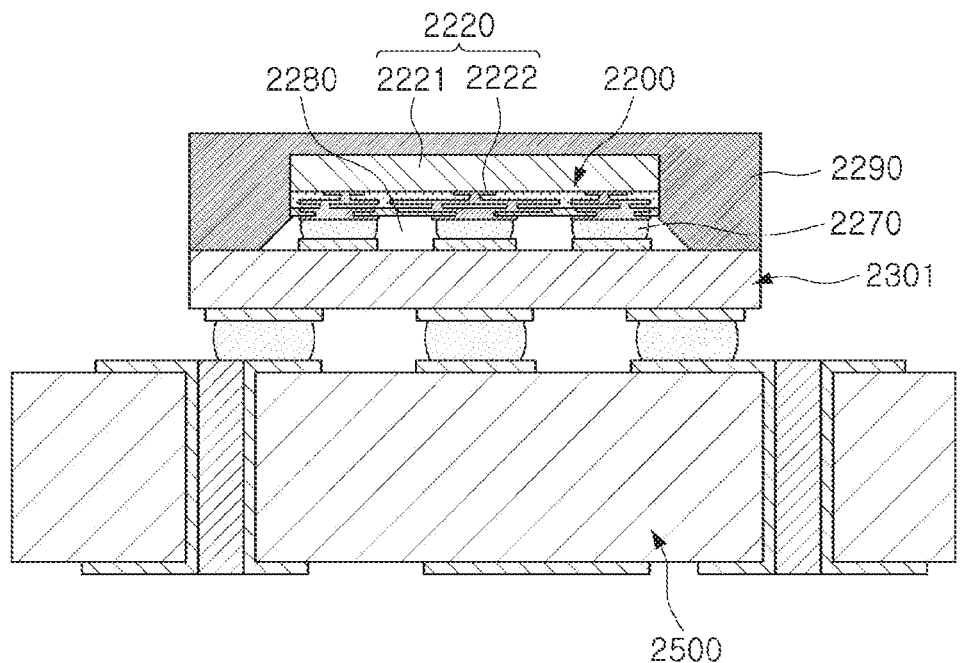
FIG. 5 is a schematic cross-sectional view illustrating a case in which a fan-in semiconductor package is mounted on an interposer substrate and is ultimately mounted on a mainboard of an electronic device.
Figure 6:
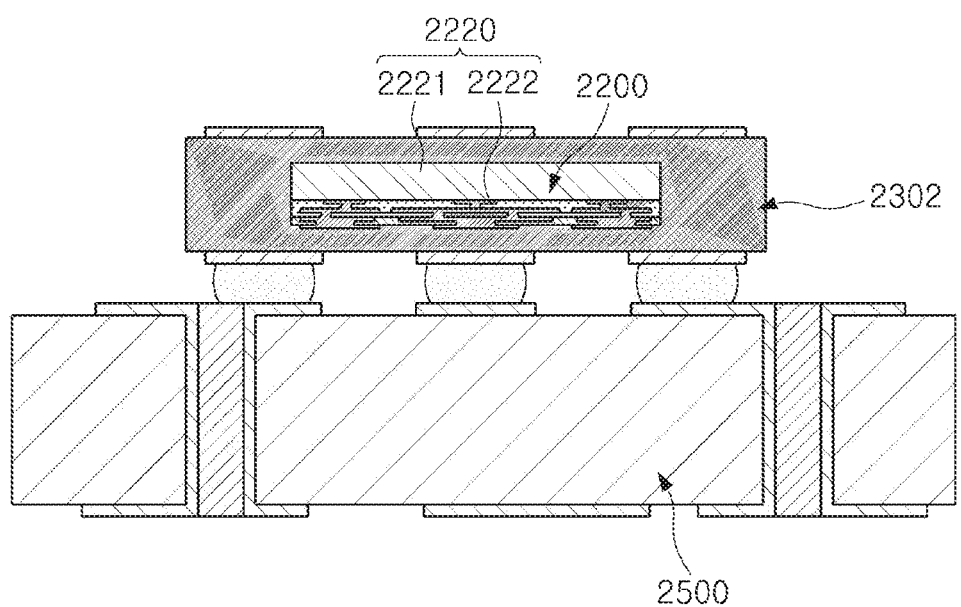
FIG. 6 is a schematic cross-sectional view illustrating a case in which a fan-in semiconductor package is embedded in an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device, and FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may ultimately be mounted on a mainboard 2500 of an electronic device in a state in which it is mounted on the interposer substrate 2301. In this case, low melting point metal or alloy balls 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may ultimately be mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
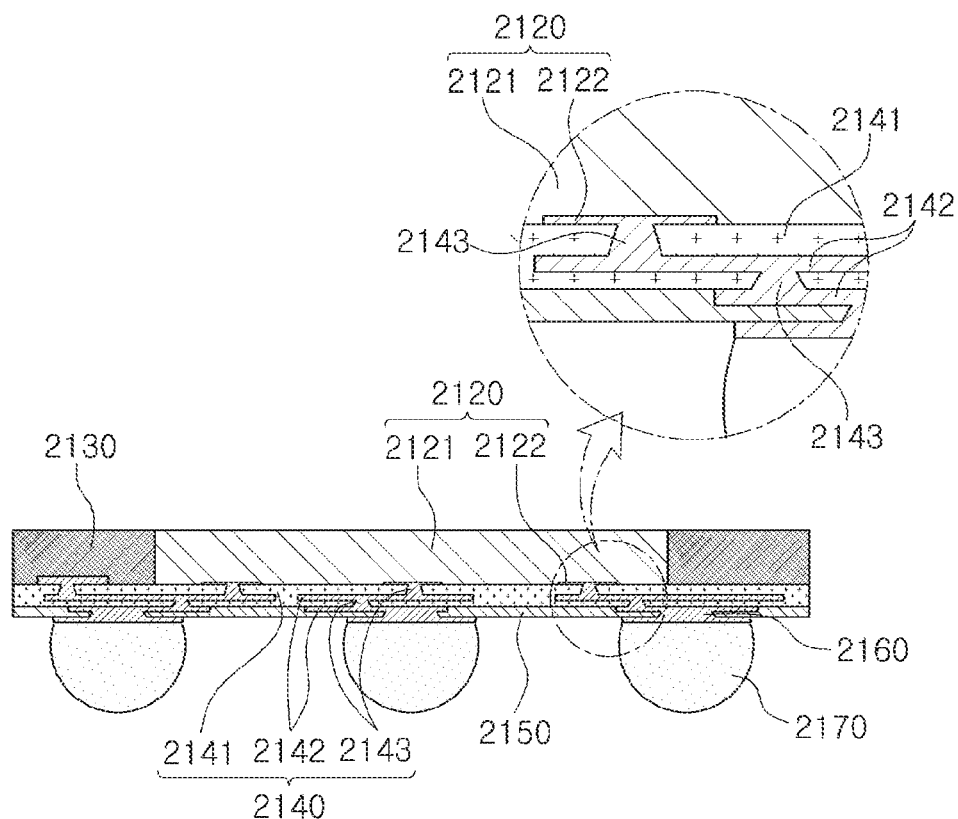
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Low melting point metal or alloy balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the manufacturing process described above, after the encapsulant 2130 is formed outside of the semiconductor chip 2120, the connection member 2140 may be provided. In this case, since forming the connection member 2140 is performed after the semiconductor chip 2120 is sealed, the via 2143, connected to a redistribution layer, may be formed to have a width which becomes smaller toward the semiconductor chip 2120 (See an enlarged area).

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
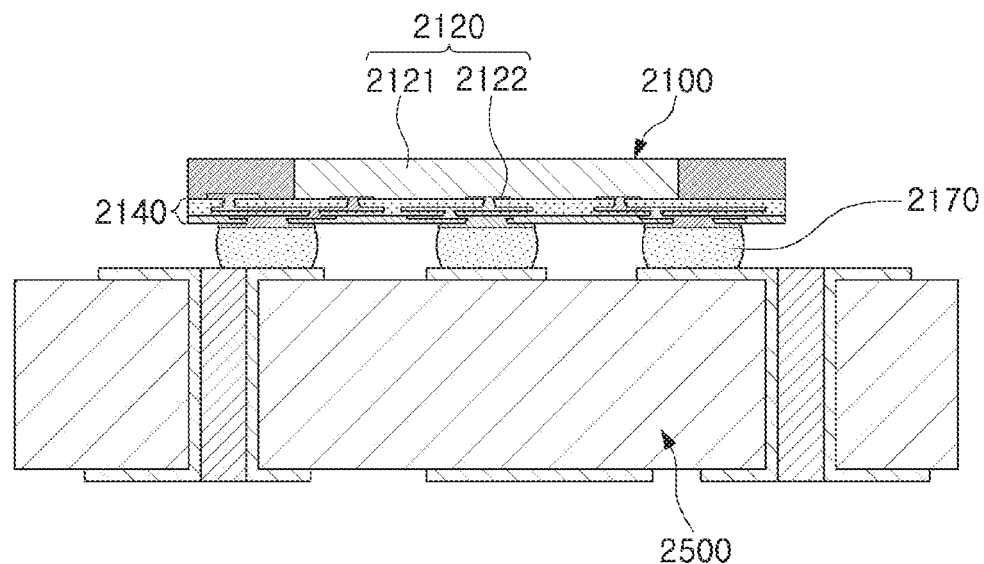
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through low melting point metal or alloy balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Hereinafter, various exemplary embodiments of the present disclosure will be described in more detail with reference to the attached drawings.

Figure 9:
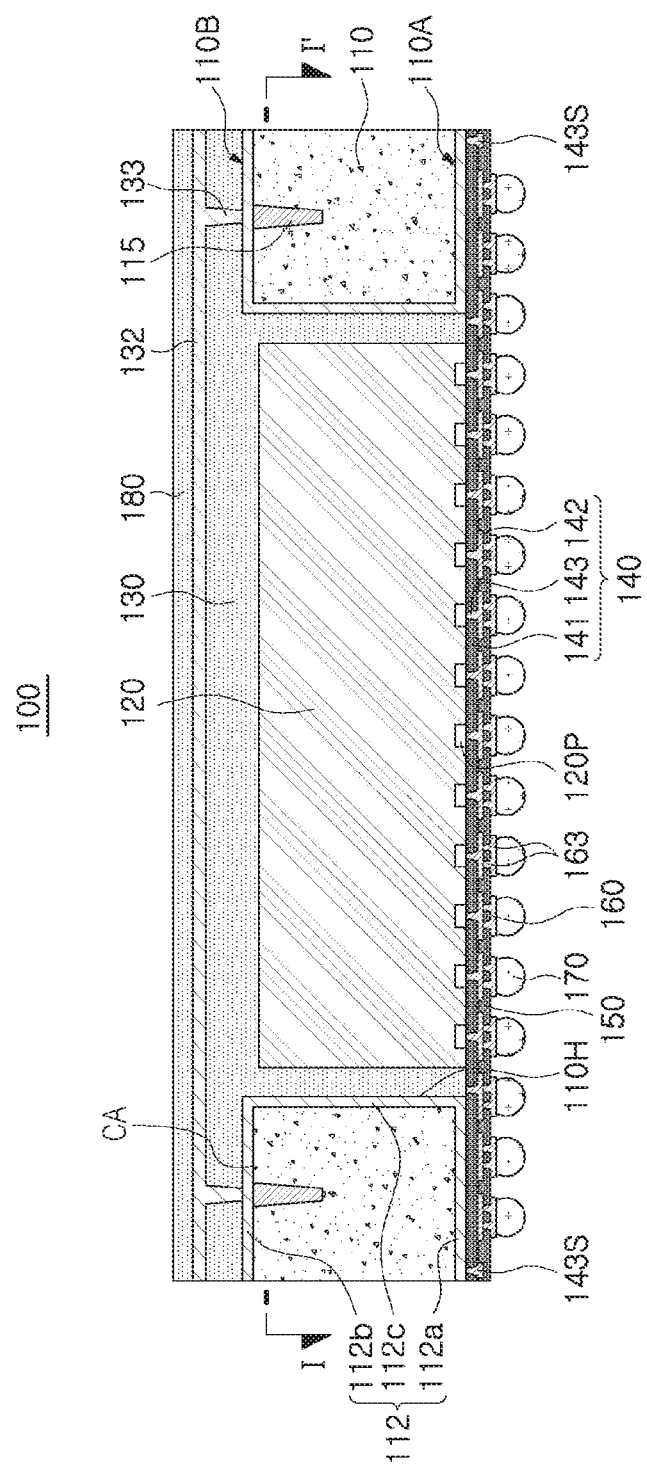
FIG. 9 is a schematic cross-sectional view of a semiconductor package according to an exemplary embodiment of the present disclosure.
Figure 10:
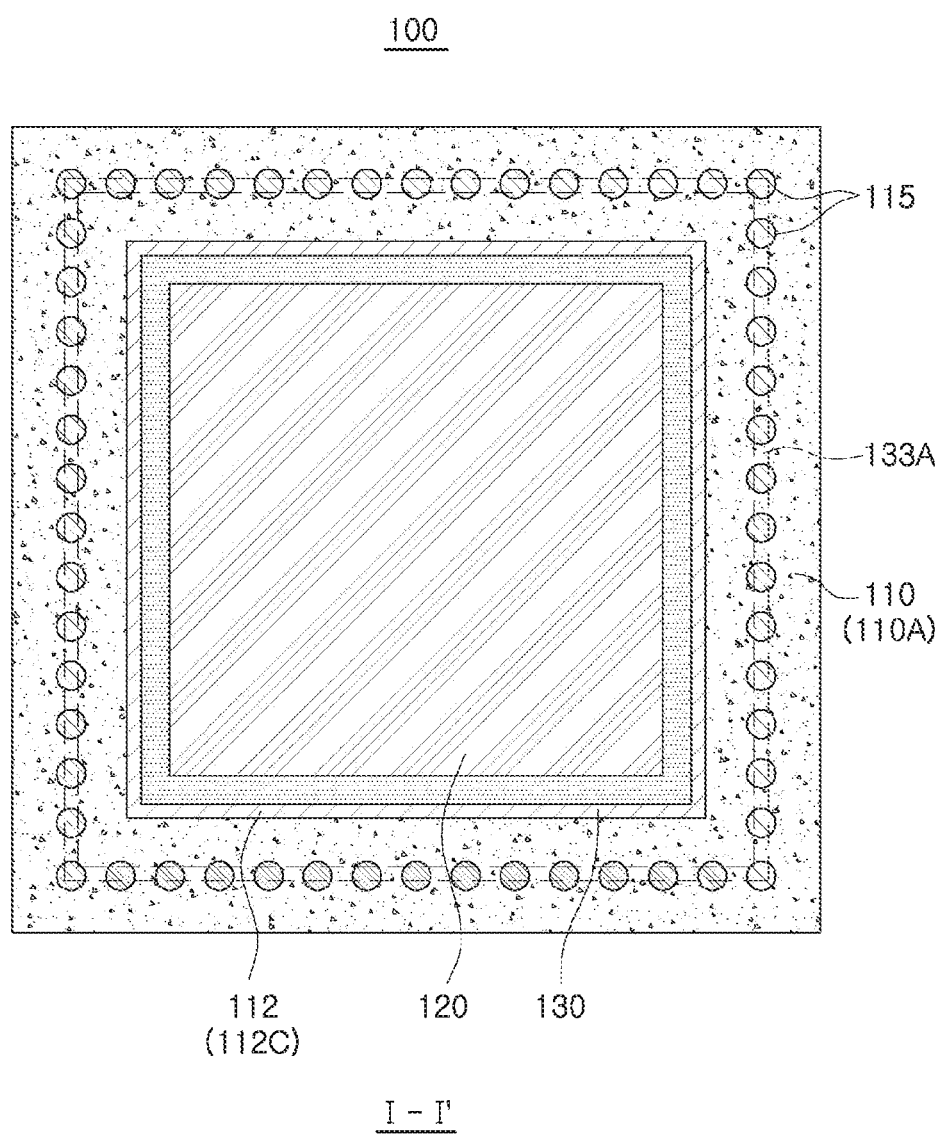
FIG. 10 is a plan view of the semiconductor package of FIG. 9 taken along line I-I'.

FIG. 9 is a side cross-sectional view illustrating a semiconductor package according to an exemplary embodiment, and FIG. 10 is a plan view of the semiconductor package illustrated in FIG. 9, taken along line I-I'.

Referring to FIGS. 9 and 10, a semiconductor package 100 according to an exemplary embodiment may include a support member 110 having a first surface 110A and a second surface 110B opposing each other and having a through-hole 110H, a connection member 140 disposed on the first surface 110A of the support member 110 and having redistribution layers 142 and 143, a semiconductor chip 120 disposed in the through-hole 110H and having a connection pad 120P connected to the redistribution layers 142 and 143, and an encapsulant 130 sealing the semiconductor chip 120 located in the through-hole 110H, and covering the second surface 110B of the support member 110.

As illustrated in FIG. 9, the semiconductor package 100 according to an exemplary embodiment may include a first metal layer for shielding 112 disposed on a surface of the support member 110, and a second metal layer for shielding 132 disposed on an upper surface of the encapsulant 130. The semiconductor package 100 may be provided with a protective layer 180 disposed to protect the second metal layer for shielding 132 from external impacts.

The first metal layer for shielding 112 may include a first metal layer 112a and a second metal layer 112b, disposed on the first surface 110A and the second surface 110B of the support member 110, as well as a third metal layer 112c connected to the first metal layer 112a and the second metal layer 112b and disposed on an internal sidewall of the through-hole 110H. The first metal layer for shielding 112 may shield electromagnetic waves generated by the semiconductor chip 120, and may be used as a heat dissipating device.

The second metal layer for shielding 132, disposed on the encapsulant 130, may be connected to the first metal layer for shielding 112 through a connecting trench via 133 passing through the encapsulant 130. The connecting trench via 133 may have a trench structure continuously surrounding the through-hole 110H in a plan view, in a manner similar to a region 133A indicated by a dotted line as illustrated in FIG. 10. The connecting trench via 133, applied to an exemplary embodiment, has a continuous trench structure described above, and thus effectively blocks electromagnetic waves, generated by the semiconductor chip 120 disposed in the through-hole 110H, without leakage.

As described above, a shielding structure according to an exemplary embodiment is provided over various components and has a connected structure, and may thus have low reliability due to thermal shock such as thermal expansion, or the like.

In detail, during application of thermal load, an encapsulant 130 having a high coefficient of thermal expansion is expanded, thereby lifting up the second metal layer for shielding 132. In this case, stress, generated at this time, may be concentrated in the connecting trench via 133. In detail, the concentrated stress may cause a separation defect in which an interface between the first metal layer for shielding 112 and the support member 110, corresponding to an interface CA between dissimilar materials, is separated. Further, a defect in which one portion of the first metal layer for shielding 112 is separated from the other portion may be caused.

The semiconductor package 100 according to an exemplary embodiment may further include a reinforcing via 115 connected to the first metal layer for shielding 112 in a region, overlapping the connecting trench via 133, of the support member 110. The reinforcing via 115 has a metal structure in contact with the first metal layer for shielding 112 and extending to an interior of the support member 110, and may allow a contact area between the first metal layer for shielding 112 and the support member 110 to be substantially increased. The reinforcing via 115 may be spaced apart from the second surface 110B of the support member 110. As a result, the reinforcing via 115 reinforces the adhesion between the first metal layer for shielding 112 and the support member 110, and may thus effectively solve a separation defect caused by thermal stress.

As illustrated in FIG. 10, the reinforcing via 115 may include a plurality of vias arranged along a region 133A overlapping the connecting trench via 133. The plurality of vias may be spaced at predetermined intervals. For example, the intervals may be the same as each other, according to design particulars. The reinforcing via 115 may include a metal, the same as or similar to the first metal layer for shielding 112 and the second metal layer for shielding 132 as well as the connecting trench via 133. For example, the reinforcing via 115 may include copper (Cu).

The support member 110, applied to an exemplary embodiment, does not include a separate wiring structure. However, in another exemplary embodiment, a wiring structure (a circuit pattern and/or a via), connected to the redistribution layers 142 and 143, may be introduced. In this case, the reinforcing via 115, applied to an exemplary embodiment, is not connected to a wiring structure of the support member 110. Even when the reinforcing via is connected to other components, the reinforcing via may be configured to only be connected to a ground pattern.

The semiconductor package 100 may include a shielding via 143S disposed to surround the connection member 130 in a region adjacent to an edge, of the connection member 130. The shielding via 143S may shield electromagnetic waves emitted through the connection member 130. The shielding via 143S may also have a trench structure continuously surrounding an outer edge of the connection member 130. The shielding via 143S may be connected to the first metal layer for shielding 112. The shielding via 143S may be provided using a process the same as a process of forming the redistribution layers 142 and 143. In other words, the shielding via 143S may be formed of a material the same as a material of the redistribution layers 142 and 143.

The support member 110 may maintain rigidity of the semiconductor package 100, and serve to secure uniformity of a thickness of the encapsulant 130. The redistribution layers 143 and 145 such as a wiring pattern and a via may be introduced to the support member 110. In this case, the semiconductor package 100 may be used as a Package-on-Package (POP) type fan-out package. The semiconductor chip 120 is disposed to be spaced apart from a side wall of the support member 110 by a predetermined distance in the through-hole 110H. Side surfaces of the semiconductor chip 120 may be surrounded by the support member 110. However, such a form is only an example and may be variously modified to have other forms, and another function may be performed depending on such a form. In an exemplary embodiment, the support member 110 may be omitted.

The support member 110 may include an insulating layer. For example, a material for the insulating layer may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. When a material, having high rigidity, such as prepreg containing a glass fiber, is used, the support member 110 may be used as a support member for warpage control of the semiconductor package 100.

The semiconductor chip 120 may be an integrated circuit (IC) provided in an amount of several hundred to several million or more elements integrated in a single chip. For example, the semiconductor chip 120 may be a processor such as a central processor (for example, a central processing unit (CPU)), a graphic processor (for example, a graphic processing unit (GPU)), a field programmable gate array (FPGA), a digital signal processor, a cryptographic processor, a microprocessor, a microcontroller, or the like, in detail, an application processor (AP). However, the present disclosure is not limited thereto, but the semiconductor chip may be a logic chip such as an analog-to-digital converter (ADC), an application-specific integrated circuit (ASIC), or the like, or a memory chip such as a volatile memory (for example, a dynamic random access memory (DRAM)), a non-volatile memory (for example, a read only memory (ROM)), a flash memory, or the like. Moreover, these chips are also combined.

The semiconductor chip 120 may be formed on the basis of an active wafer. In this case, a base material of a body 121 of the semiconductor chip may be silicon (Si), germanium (Ge), gallium arsenide (GaAs), or the like. The connection pad 120P may electrically connect the semiconductor chip 120 to other components, and may include a metal such as aluminum (Al). The semiconductor chip 120 may be a bare die, if necessary, the semiconductor chip 120 may have a redistribution layer (not shown) formed on a surface (that is, an active surface) on which the connection pad 120P is formed, and a conductive bump (not shown) connected to the connection pad 120P.

The encapsulant 130 may be provided to have a structure for protecting an electronic component such as the support member 110 and the semiconductor chip 120. An encapsulant shape is not particularly limited, as long as at least a portion of the support member 110 and the semiconductor chip 120 is surrounded. As in an exemplary embodiment, the encapsulant 130 may cover the second surface 110B of the support member 110 and the semiconductor chip 120, and may fill a space between an internal sidewall of the through-hole 110H and a side surface of the semiconductor chip 120. In some exemplary embodiments, the encapsulant 130 may fill at least a portion of a space between the semiconductor chip 120 and the connection member 140. The encapsulant 130 may fill the through-hole 110H to thus serve as an adhesive and reduce buckling, depending on certain materials.

For example, the encapsulant 130 may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber, for example, prepreg, ABF, FR-4, BT, or the like. In some exemplary embodiments, a PID resin may also be used as the encapsulant.

The connection member 140 may redistribute the connection pad 120P of the semiconductor chip 120. Several tens to several hundreds of connection pads 120P, of the semiconductor chip 120, having various functions may be redistributed by the connection member 140, and may be physically or electrically externally connected through the electrical connection structure 170 depending on the functions. The connection member 140 may be disposed on the support member 110 and an active surface of the semiconductor chip 120.

The connection member 140 may include an insulating layer 141, a redistribution pattern 142 disposed on the insulating layer 141, and a redistribution via 143 passing through the insulating layer 141 and connecting the connection pad 120P to the redistribution pattern 142. The redistribution pattern 142 may serve to redistribute the connection pad 122 together with the redistribution via 143. In an exemplary embodiment, a single layer redistribution structure is illustrated, byway of example. However, in a manner different from an exemplary embodiment, a multilayer redistribution structure may be provided.

For example, the insulating layer 141 may include a photosensitive insulating material such as a PID resin, in addition to the insulating material described previously. When the photosensitive insulating material is used, the insulating layer 141 may be provided to be further thinner, and a fine pitch of the redistribution via 143 may be achieved more easily. The insulating layer 141 may have a thickness thereof between patterns except for the redistribution pattern 142 of about 1 µm to 10 µm.

The redistribution pattern 142 may perform various functions depending on designs of its corresponding layer. For example, the redistribution pattern 142 may include ground (GND) patterns, power (PWR) patterns, signal (S) patterns, and the like. Here, the S pattern may include various signals except for a GND pattern, a PWR pattern, or the like, for example, data signals, or the like. In addition, pad patterns for vias, pad patterns for electrical connection structures, and the like may be included therein. For example, the redistribution pattern 142 may include a conductive material such as copper (Cu), aluminum (Al), silver (Ag), tin (Sn), gold (Au), nickel (Ni), lead (Pb), titanium (Ti), or alloys thereof. A thickness of the redistribution pattern 142 may be about 0.5 µm to 15 µm.

The redistribution via 143 may be used as an element (an interlayer connection element), for connecting conductive elements located on different levels (for example, a connection pad and a redistribution pattern or redistribution patterns formed on different insulating layers) in a vertical direction. For example, the redistribution via 143 may include a conductive material such as copper (Cu), aluminum (Al), silver (Ag), tin (Sn), gold (Au), nickel (Ni), lead (Pb), titanium (Ti), or alloys thereof. The redistribution via 143 is entirely filled with the conductive material, or the conductive material is also formed along a wall of the via. Moreover, the redistribution via 143 may have various shapes such as a tapered or cylindrical shape.

The underbump metal (UBM) layer 160 may improve connection reliability of the electrical connection structure 170 to improve board level reliability of the semiconductor package 100, for example, a fan-out semiconductor package. The UBM layer 160 is disposed in the passivation layer 150 to be connected to the redistribution pattern 142 of the connection member 140. The UBM layer 160, applied to an exemplary embodiment, may be connected to the redistribution pattern 142 by a plurality of UBM vias 163 passing through the passivation layer 150.

The electrical connection structure 170 physically or electrically connects the semiconductor package 100 to an external source. For example, the fan-out semiconductor package 100 may be mounted on a main board of an electronic device through the electrical connection structure 170. The electrical connection structure 170 may be formed of a conductive material, for example, a low melting point alloy such as a tin (Sn)-aluminum (Al)-copper (Cu) alloy, but an exemplary embodiment is not limited thereto. The electrical connection structure 170 may be a land, a ball, a pin, or the like. The electrical connection structure 170 may include a single layer or a plurality of layers. When the electrical connection structure includes a plurality of layers, the electrical connection structure may include a copper (Cu) pillar and a low melting point alloy. The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands, according to the number of connection pads 120P, or may be provided in an amount of several tens to several thousands or more or several tens to several thousands or less.

A portion of the electrical connection structure 170 may be disposed in a fan-out region. The fan-out region refers to a region except for a region in which the semiconductor chip 120 is disposed. The fan-out package may have excellent reliability as compared to a fan-in package, may allow a plurality of input/output (I/O) terminals to be implemented, and may facilitate a 3D interconnection. In addition, as compared to a ball grid array (BGA) package, a land grid array (LGA) package, or the like, the fan-out package may be manufactured to have a small thickness.

In an exemplary embodiment, a reinforcing via is described in the form of a plurality of vias, byway of example, but may implemented to various forms as a structure for reinforcing adhesion between the first metal layer for shielding 112 and the support member 110.

Figure 11A:
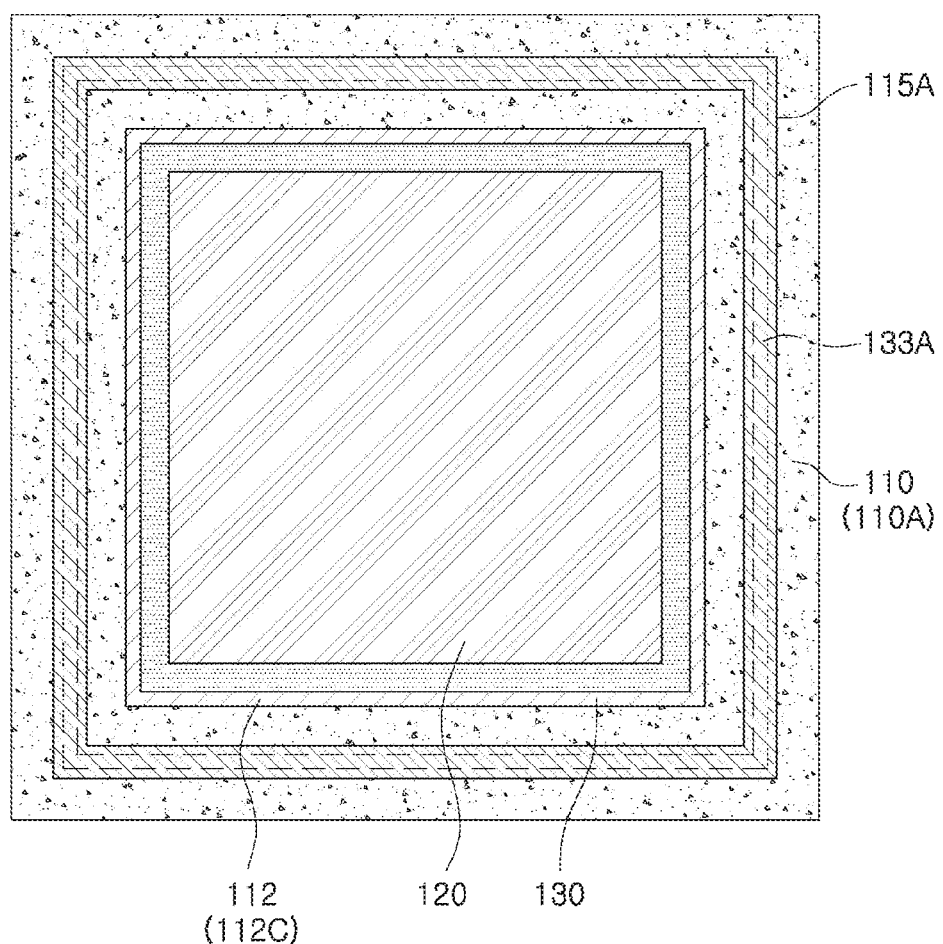
FIGS. 11A and 11B are plan views illustrating a semiconductor package according to various exemplary embodiments of the present disclosure.
Figure 11B:
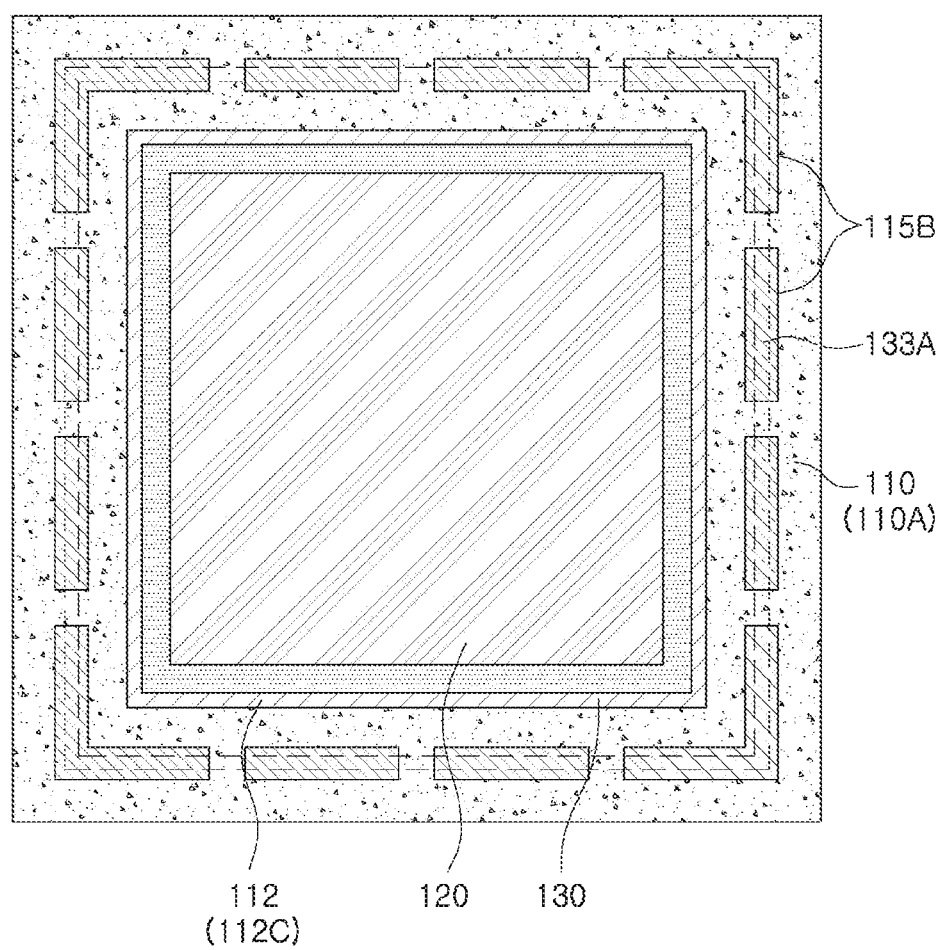

FIGS. 11A and 11B are plan views illustrating a semiconductor package according to various exemplary embodiments, and may be understood as a plan view of the semiconductor package, illustrated in FIG. 9, taken along line I-I', a drawing corresponding to FIG. 10.

First, a semiconductor package 100A, illustrated in FIG. 11A, may include a reinforcing via 115A having a single continuous trench structure, in a manner similar to the connecting trench via (133 of FIG. 9). The reinforcing via 115A may have a single trench structure extending along a region 133A, overlapping the trench via for connection.

The semiconductor package 100B, illustrated in FIG. 11B, may include a reinforcing via 115B having a plurality of trench regions arranged along a region 133A, overlapping the trench via for connection. The plurality of trench regions may be arranged to be spaced apart from each other at predetermined intervals.

The reinforcing vias 115A and 115B, applied to an exemplary embodiment, may be formed to have a width greater than that of the region 133A, overlapping the trench via for connection, by way of example, but are not limited thereto. For example, the reinforcing vias 115A and 115B may be formed to have a width smaller than that of the region 133A, overlapping the trench via for connection, or to overlap a portion of the region 133A, overlapping the trench via for connection.

The reinforcing via has another structure modified so as to increase bonding strength with a support member, and may thus further reinforce adhesion between the support member and the first metal layer for shielding. Such an exemplary embodiment is illustrated in FIGS. 12A and 12B.

Figure 12A:
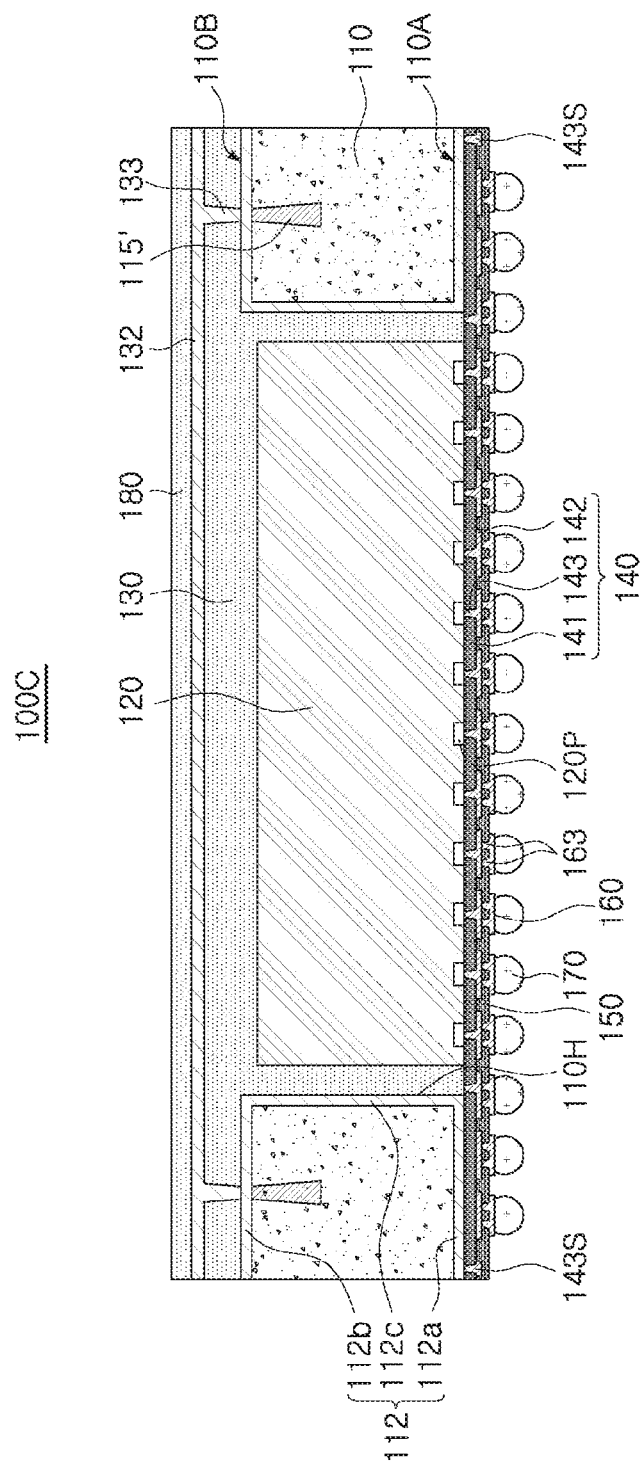
FIGS. 12A and 12B are cross-sectional views illustrating a semiconductor package according to various exemplary embodiments of the present disclosure.
Figure 12B:
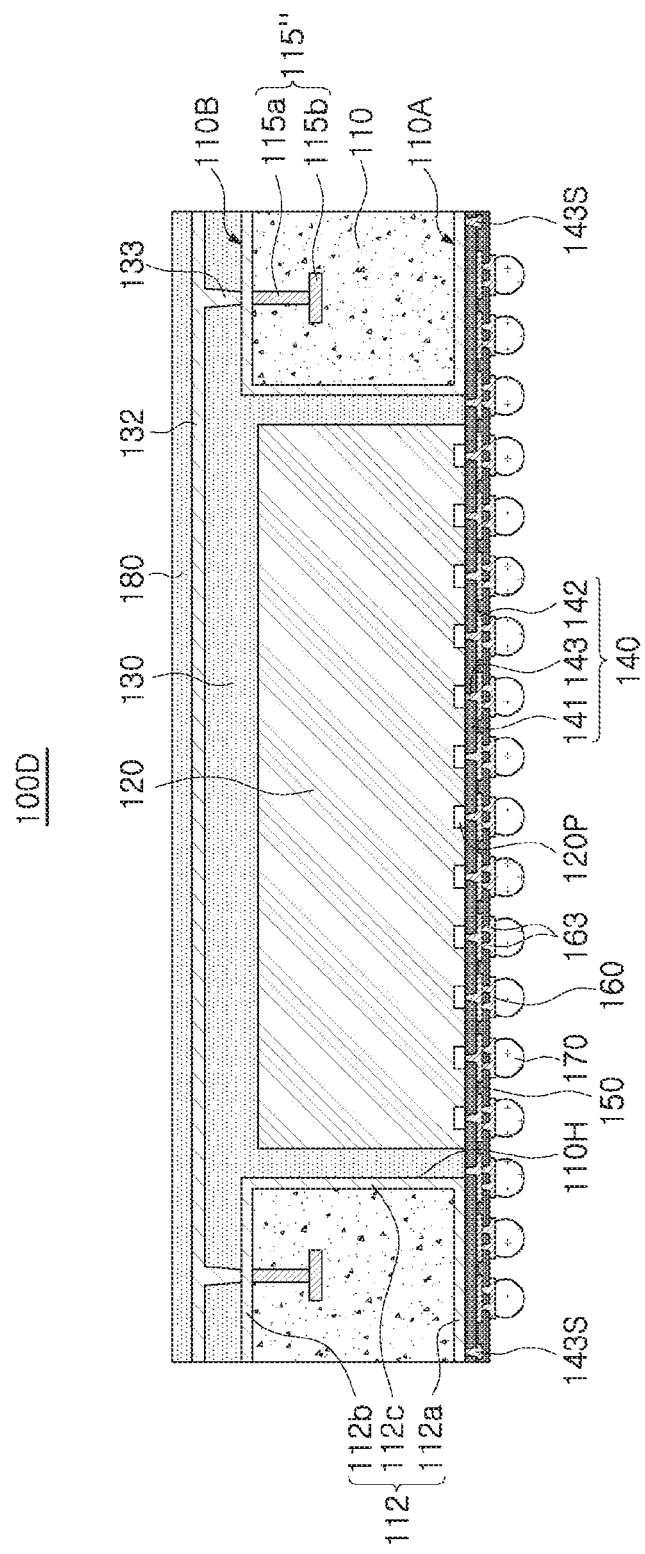

FIGS. 12A and 12B are cross-sectional views illustrating a semiconductor package according to various exemplary embodiments, and may be understood as a cross-section of the semiconductor package, corresponding to FIG. 9.

First, in a semiconductor package 100C, illustrated in FIG. 12A, the reinforcing via may include a reinforcing via 115' having a trapezoidal shape when viewed in a cross-section in a thickness direction of the support member. In the reinforcing via 115' having the trapezoidal shape, a width thereof located in the support member 110 is provided to be greater than a width of a portion, in contact with the first metal layer for shielding 112. Thus, the reinforcing via 115' may be more firmly bonded to the support member 110. Thus, even when stress in which a cover, the second metal layer for shielding 132, is lifted up is increased, the first metal layer for shielding 112 may be strongly adhered to a surface of the support member 110.

A semiconductor package 100D, illustrated in FIG. 12B, may include a reinforcing via 115" having a metal pattern 115b located in the support member 110 and a via 115a connected thereto. The metal pattern 115b is located in the support member 110 and has a relatively large area, so the reinforcing via 115" may be more firmly bonded to the support member 110.

When a wiring structure (a circuit pattern and/or a via) connected to the redistribution layers 142 and 143 is applied to the support member 110, the metal pattern 115b of the reinforcing via 115" may be a metal pattern, a portion of a wiring structure. For example, the metal pattern 115b may be provided as a ground pattern.

Figure 13:
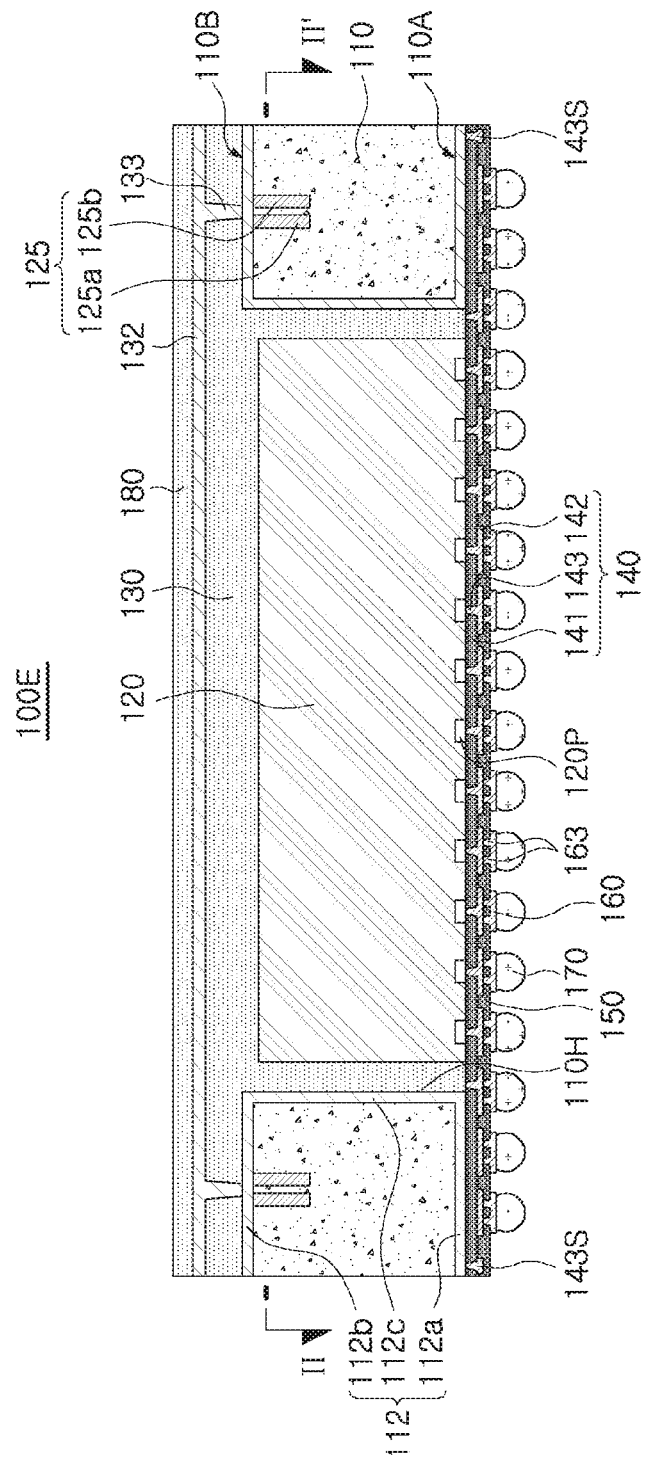
FIGS. 13 and 14 are a cross-sectional view and a plan view of a semiconductor package according to an exemplary embodiment of the present disclosure.
Figure 14:
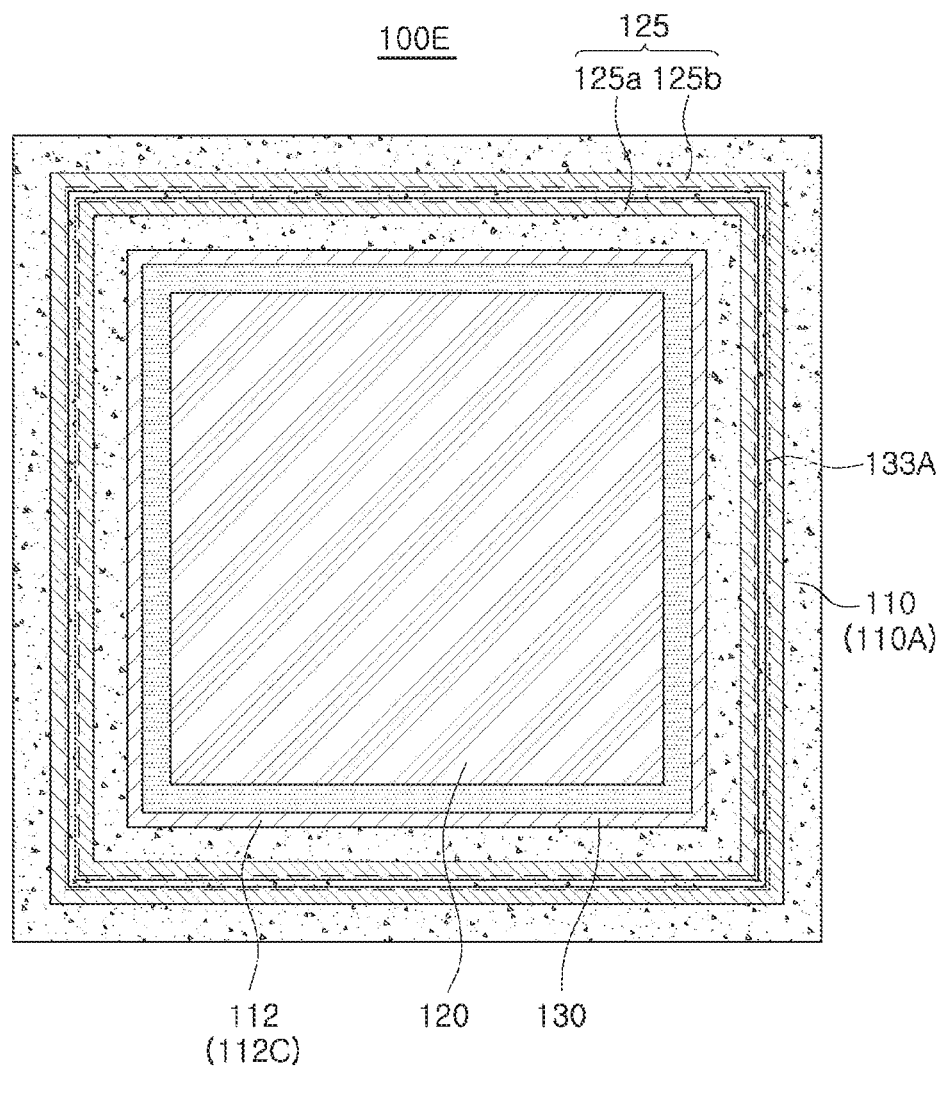

FIG. 13 is a cross-sectional view of a semiconductor package according to an exemplary embodiment of the present disclosure, and FIG. 14 is a plan view of the semiconductor package illustrated in FIG. 13, taken along line II-II'.

Referring to FIGS. 13 and 14, a semiconductor package 100E according to an exemplary embodiment may be understood to be similar to the structure illustrated in FIG. 11A, except that a reinforcing via 125 having a dual structure is included. The description of the components according to an exemplary embodiment may be referred to the description of the same or similar components of the semiconductor package 100A illustrated in FIG. 11A, unless specifically explained otherwise.

The reinforcing via 125, applied to an exemplary embodiment, may have a first via 125a and a second via 125b having different intervals from the through-hole 110H. Each of the first via 125a and the second via 125b is illustrated as having a single trench structure, by way of example, but at least one of the first via 125a and the second via 125b may be provided as an arrangement of vias (See FIG. 10) or a plurality of trenches (See FIG. 12B). The first via 125a and the second via 125b may be arranged to only overlap a portion of a region 133A, overlapping the trench via for connection. In another exemplary embodiment, even when the first via 125a and the second via 125b do not overlap, the first via 125a and the second via 125b are disposed in both sides of the region 133A, overlapping the trench via for connection. Thus, adhesion strength between the first metal layer for shielding 112 and the support member 110 may be sufficiently improved. The reinforcing via 125 according to an exemplary embodiment is provided to have a dual structure, thereby further significantly improving adhesion strength.

Figure 15:
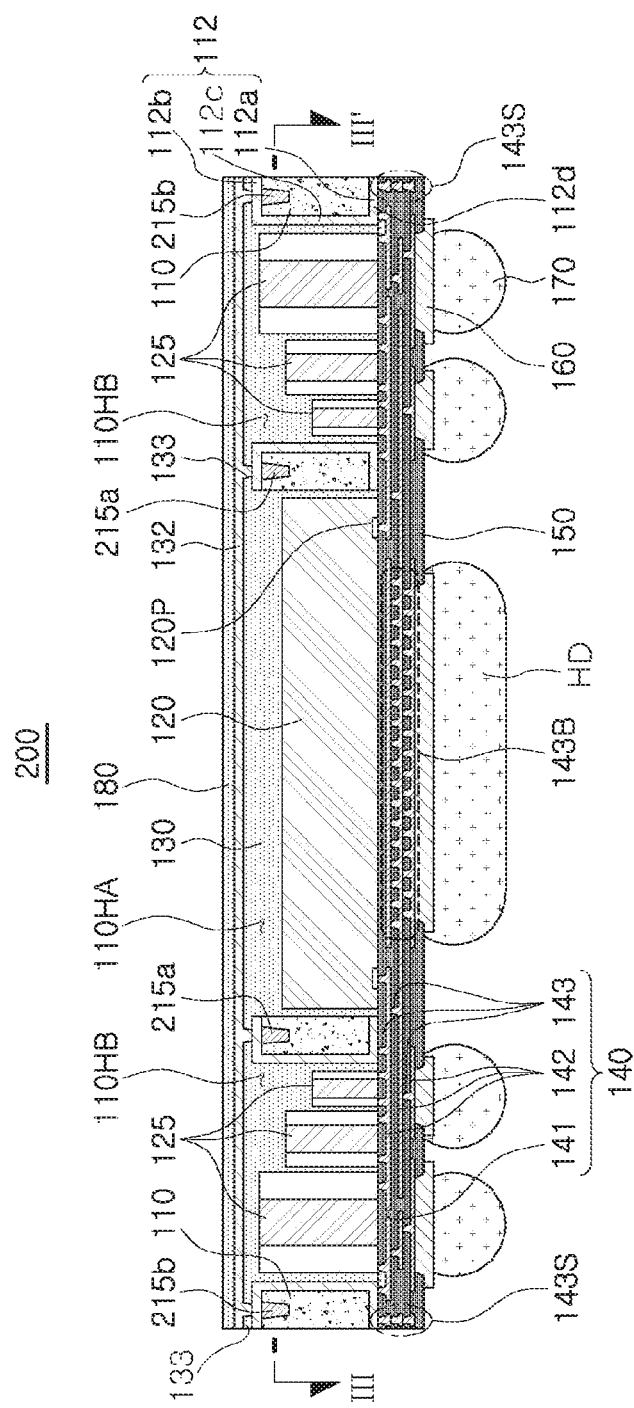

FIG. 15 is a cross-sectional view illustrating a semiconductor package according to an exemplary embodiment, and FIG. 16 is a plan view of the semiconductor package illustrated in FIG. 15, taken along line.

Referring to FIGS. 15 and 16, a semiconductor package 200 according to an exemplary embodiment may include a support member 110 having a first surface and a second surface opposing each other and having a first through-hole 110HA and second through-holes 110HB and 110HC, a connection member 140 disposed on the second surface of the support member 110 and having redistribution layers 142 and 143, a semiconductor chip 120 disposed in the first through-hole 110HA and having a connection pad 120P connected to the redistribution layers 142 and 143, a passive component 125 disposed in the second through-hole 110HB and connected to the redistribution layers 142 and 143, and an encapsulant 130 sealing the semiconductor chip 120 and the passive component 125, and covering the second surface of the support member 110. The description of the components according to an exemplary embodiment may be referred to the description of the same or similar components of the semiconductor package 100 illustrated in FIGS. 9 and 10, unless specifically explained otherwise.

The semiconductor package 200 according to an exemplary embodiment may include a first metal layer for shielding 112 disposed on a surface of the support member 110, and a second metal layer for shielding 132 disposed on an upper surface of the encapsulant 130. The semiconductor package 200 may be provided with a protective layer 180 disposed to protect the second metal layer for shielding 132 from external impacts.

The first metal layer for shielding 112 may shield electromagnetic interference between the semiconductor chip 120 and the passive component 125, disposed in the first through-hole 110HA and the second through-hole 110HB, different from each other.

The first metal layer for shielding 112 may include a first metal layer 112a and a second metal layer 112b, disposed on the first surface and the second surface of the support member 110, as well as a third metal layer 112c connected to the first metal layer 112a and the second metal layer 112b. As in an exemplary embodiment, the third metal layer 112c may be disposed on an internal sidewall of the second through-hole 110HB in which the passive component 125 is located. Here, the third metal layer 112c may be formed on an internal sidewall of the first through-hole 110HA. However, even when the third metal layer is formed on an internal sidewall of the second through-hole 110HB, a sufficient shielding effect between components may be expected.

The second metal layer for shielding 132, disposed on the encapsulant 130, may be connected to the first metal layer for shielding 112 through a connecting trench via 133 passing through the encapsulant 130. The connecting trench via 133 may be provided to have a trench structure continuously surrounding the first through-hole 110HA and the second through-hole 110HB. The first metal layer for shielding 112 and the second metal layer for shielding 132 may be provided to have a single shielding structure by the connecting trench via 133.

The semiconductor package 200 according to an exemplary embodiment may further include a reinforcing via 215 connected to the first metal layer for shielding 112 in a region, overlapping the connecting trench via 133, of the support member 110. The reinforcing via 215 has a metal structure in contact with the first metal layer for shielding 112 and extended to an interior of the support member 110, and may allows a contact area between the first metal layer for shielding 112 and the support member 110 to be substantially increased. Thus, an interface between the first metal layer for shielding 112 and the support member 110 is effectively prevented from being separated by stress, concentrated on the connecting trench via 133, during thermal expansion of the encapsulant 130.

The reinforcing via 215, applied to an exemplary embodiment, may be divided into a first reinforcing via 215a located around the first through-hole 110HA in which the semiconductor chip 120 is located, a second reinforcing via 215b disposed along a region adjacent to an outer edge of the support member 110, and a third reinforcing via 215c located in a portion of the support member 110, connecting the first reinforcing via 215a to the second reinforcing via 215b.

The reinforcing via 215 is a structure for stably maintaining a shielding structure (in detail, a first shielding structure and a second shielding structure) from thermal stress, rather than a shielding device. In this regard, the reinforcing via may be disposed in consideration of mechanical stability. In this regard, the reinforcing via 215 does not need to be provided in all regions, overlapping the connecting trench via 133, of the support member, and may be only provided in a portion, of the region, overlapping the trench via for connection. For example, even when only the second reinforcing via 125b, corresponding to an outer edge of the semiconductor package 200, is provided, separation of a shielding structure may be effectively prevented.

The connection member 140 may be provided with a redistribution layer including an insulating member 141, as well as a redistribution pattern 142 and a redistribution via 143, formed in the insulating member 141. The redistribution layers 142 and 143, applied to an exemplary embodiment, are illustrated in having a three-layer structure, but are not limited thereto. The connection member 140 may include a shielding via 143S disposed to surround the connection member in a region adjacent to an edge. The shielding via 143S, applied to an exemplary embodiment, is connected to the first metal layer for shielding 112, and may have a via stack structure in which a via, corresponding to a redistribution via 143 of each layer, is overlapped.

The connection member 140, applied to an exemplary embodiment, may include a heat dissipation structure HD located on an active surface of the semiconductor chip 120. The heat dissipation structure HD may be connected to a via stack 143B formed together in a process of forming a redistribution layer. The heat dissipation structure HD is connected to a mainboard through an electrical connection structure 170 to effectively release heat generated by the semiconductor chip 120.

The semiconductor chip 120 (that is, a connection pad), disposed in the first through-hole 110HA, and the passive component 125 (that is, a connection terminal), disposed in the second through-hole 110HB, may be connected to the redistribution layers 142 and 143 of the connection member 140. A passivation layer 150 is disposed on a lower surface of the connection member 140, and an underbump metal layer 160, electrically connected to the redistribution layer 142, may be disposed in an opening of the passivation layer 150. The electrical connection structure 170 may be electrically connected to the redistribution layer 142 through the underbump metal layer 160.

As set forth above, according to an exemplary embodiment, a reinforcing via for reinforcing adhesion, connected to a first shielding layer, is provided to a support member, so a separation problem due to structural vulnerability at a point in which the first shielding layer is connected to a second shielding layer, a cover structure (that is, adhesion weakness of the first shielding layer and the support member) may be solved.

While exemplary embodiments have been shown and described above, it will be apparent to those skilled in the art that modifications and variations could be made without departing from the scope of the present invention as defined by the appended claims.

What is claimed is:

1. A semiconductor package, comprising:
   a support member having a first surface and a second surface opposing each other, and having a through-hole;
   a first metal layer disposed on an internal sidewall of the through-hole and the first surface and the second surface of the support member;
   a connection member disposed on the first surface of the support member, and having a redistribution layer;
   a semiconductor chip disposed in the through-hole, and having a connection pad connected to the redistribution layer;
   an encapsulant sealing the semiconductor chip located in the through-hole, and covering the second surface of the support member;
   a second metal layer disposed on the encapsulant, and connected to the first metal layer by a connecting trench via passing through the encapsulant; and
   a reinforcing via disposed in a region, overlapping the connecting trench via, of the support member, and connected to the first metal layer.

2. The semiconductor package of claim 1, wherein the reinforcing via includes a plurality of vias arranged along the region which overlaps the connecting trench via.

3. The semiconductor package of claim 1, wherein the reinforcing via has a single trench structure extending along the region which overlaps the connecting trench via.

4. The semiconductor package of claim 3, wherein the reinforcing via has a plurality of trench structures spaced apart at predetermined intervals along the region which overlaps the connecting trench via.

5. The semiconductor package of claim 1, wherein the reinforcing via has a trapezoidal shape when viewed in a cross-section in a thickness direction of the support member.

6. The semiconductor package of claim 1, wherein the reinforcing via is connected to a metal pattern located in the support member.

7. The semiconductor package of claim 1, wherein the connecting trench via surrounds the through-hole in a plan view perpendicular to a thickness direction of the support member.

8. The semiconductor package of claim 1, further comprising: a shielding via surrounding the connection member in a region, adjacent to an edge, of the connection member, and connected to the first metal layer.

9. The semiconductor package of claim 8, wherein the shielding via is formed of a material the same as a material of the redistribution layer.

10. The semiconductor package of claim 1, further comprising: a heat dissipating device disposed in a region, corresponding to the semiconductor chip, of the connection member.

11. The semiconductor package of claim 1, wherein the reinforcing via includes a first via and a second via, located in a region adjacent to the region which overlaps the connecting trench via, and surrounding the through-hole.

12. A semiconductor package, comprising:
    a support member having a first surface and a second surface opposing each other, and having a first through-hole and a second through-hole;
    a first metal layer disposed on at least an internal sidewall of the second through-hole and the first surface and the second surface of the support member;
    a connection member disposed on the first surface of the support member, and having a redistribution layer;
    a semiconductor chip disposed in the first through-hole, and having a connection pad connected to the redistribution layer;
    at least one passive component disposed in the second through-hole, and having a connection terminal connected to the redistribution layer;
    an encapsulant sealing the semiconductor chip and the at least one passive component, and covering the second surface of the support member;
    a second metal layer disposed on the encapsulant;
    a connecting trench via passing through the encapsulant to connect the first metal layer to the second metal layer, and surrounding the first through-hole and the second through-hole in a plan view perpendicular to a thickness direction of the support member; and
    a reinforcing via disposed in at least a portion of a region, overlapping the connecting trench via, of the support member, and connected to the first metal layer.

13. The semiconductor package of claim 12, wherein the connecting trench via has a portion disposed along a region adjacent to an outer edge of the support member, and the reinforcing via has a portion disposed along a region adjacent to the outer edge of the support member.

14. The semiconductor package of claim 12, further comprising: a shielding via surrounding the connection member in a region, adjacent to an edge, of the connection member, and having a via stack structure connected to the first metal layer.

* * * * *